(12) United States Patent
Huang

(10) Patent No.: US 11,846,672 B2
(45) Date of Patent: Dec. 19, 2023

(54) METHOD AND DEVICE FOR TESTING SYSTEM-ON-CHIP, ELECTRONIC DEVICE USING METHOD, AND COMPUTER READABLE STORAGE MEDIUM

(71) Applicant: HON HAI PRECISION INDUSTRY CO., LTD., New Taipei (TW)

(72) Inventor: Jun-Kui Huang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 142 days.

(21) Appl. No.: 17/517,873

(22) Filed: Nov. 3, 2021

(65) Prior Publication Data

US 2022/0137125 A1 May 5, 2022

(30) Foreign Application Priority Data

Nov. 4, 2020 (CN) .......................... 202011218199.7

(51) Int. Cl.
*G01R 31/3177* (2006.01)
*G01R 31/3183* (2006.01)

(52) U.S. Cl.
CPC .  *G01R 31/3177* (2013.01); *G01R 31/318314* (2013.01); *G01R 31/318371* (2013.01); *G01R 31/318378* (2013.01)

(58) Field of Classification Search
CPC ........ G01R 31/3177; G01R 31/318314; G01R 31/318371; G01R 31/318378
USPC ......................................... 714/735, 724, 742
See application file for complete search history.

(56) References Cited

U.S. PATENT DOCUMENTS

| | | | | |
|---|---|---|---|---|
| 7,725,784 | B2 * | 5/2010 | Laouamri | G06F 11/2294 714/724 |
| 10,082,538 | B2 * | 9/2018 | Siva | G01R 31/31727 |
| 10,295,596 | B1 * | 5/2019 | Ovadia | G01R 31/318307 |
| 10,969,433 | B1 * | 4/2021 | Nerukonda | G06F 9/30134 |
| 2005/0004777 | A1 | 1/2005 | Houlihane | |
| 2007/0113123 | A1 * | 5/2007 | Crouch | H04L 49/65 714/724 |

(Continued)

FOREIGN PATENT DOCUMENTS

WO     2020112999 A1    6/2020

OTHER PUBLICATIONS

Jiang et al., A Test Generation Approach for Systems-on-Chip that use Intellectual Property Cores, 2003, IEEE, pp. 1-4. (Year: 2003).*

(Continued)

*Primary Examiner* — John J Tabone, Jr.
(74) *Attorney, Agent, or Firm* — ScienBiziP, P.C.

(57) ABSTRACT

A method for testing systems on a chip during manufacture obtains basic function information of intellectual property cores and relevant information of network on chip and generates one or more test names according to the basic function information, and the relevant information of the network on chip. The method invokes a pre-prepared integral script to construct a running environment configured to invoke basic function scripts of to-be-tested intellectual property cores one by one, according to each of the test names which are generated. The method also generates the results of testing. A related electronic device and a non-transitory storage medium are also disclosed.

17 Claims, 3 Drawing Sheets

(56) References Cited

U.S. PATENT DOCUMENTS

| | | | | |
|---|---|---|---|---|
| 2014/0317427 A1* | 10/2014 | Hill | ................... | G06F 1/3206 |
| | | | | 713/320 |
| 2016/0139204 A1* | 5/2016 | Han | ................. | G06F 11/2273 |
| | | | | 702/120 |
| 2016/0142280 A1* | 5/2016 | Krishnamoorthy | ... | G06F 11/263 |
| | | | | 703/20 |
| 2018/0218102 A1* | 8/2018 | Ledzius | ............... | G06F 16/284 |
| 2019/0121713 A1* | 4/2019 | Klazynski | ...... | G01R 31/318536 |
| 2020/0241070 A1* | 7/2020 | Kishore | .......... | G01R 31/31907 |
| 2022/0137125 A1* | 5/2022 | Huang | ............... | G06F 11/263 |
| | | | | 714/735 |

OTHER PUBLICATIONS

Gupta et al., Introducing Core-Based System Design, 1997, IEEE, pp. 15-25. (Year: 1997).*

Wala et al., Integrating and Verifying Intellectual Property Blocks using Platform Express and ModelSim, 2005, IEEE, pp. 758-761. (Year: 2005).*

* cited by examiner

METHOD AND DEVICE FOR TESTING SYSTEM-ON-CHIP, ELECTRONIC DEVICE USING METHOD, AND COMPUTER READABLE STORAGE MEDIUM

FIELD

The subject matter herein generally relates to processor manufacturing and particularly, to a method and a device for testing chips, an electronic device using method, and a computer readable storage medium.

BACKGROUND

Required functions of a system-on-chip (hereinafter SoC) are constantly increasing. The number of intellectual property (hereinafter IP) cores is also increasing. During testing the SoC, a number of manpower and material resources are input to construct a number of testing scripts to test the IP cores. However, human-generated test scripts may be omitted, thereby a function test of the SoC may be incomplete.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
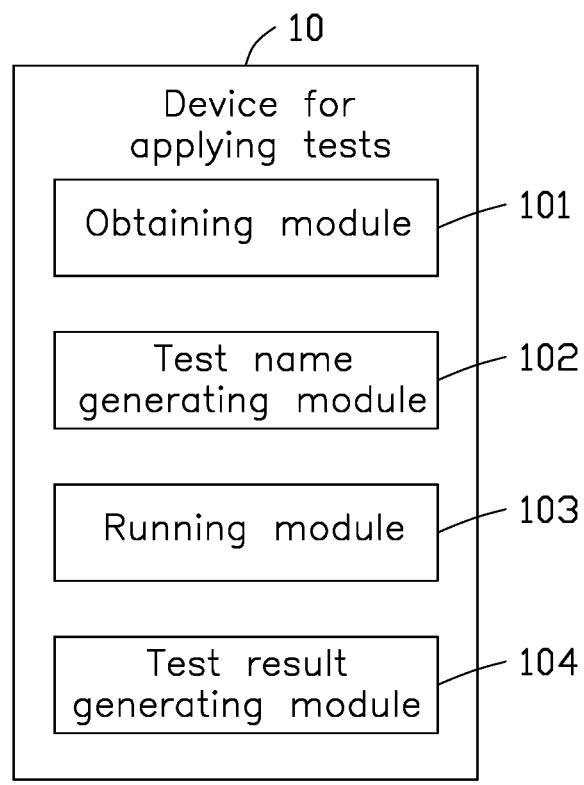
FIG. 1 illustrates a block diagram of a first embodiment of a device for applying tests according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, referencing the accompanying drawings, is illustrated by way of examples and not by way of limitation. It should be noted that references to "an" or "one" embodiment in this disclosure are not necessarily to the same embodiment, and such references mean "at least one."

FIG. 1 illustrates a block diagram of a first embodiment of a device for applying tests (device for testing 10). The device for testing 10 can be installed in an electronic device. The electronic device can be a smart phone, a desktop computer, a tablet computer, or the like. The device for testing 10 can include an obtaining module 101, a test name generating module 102, a running module 103, and a test result generating module 104. The obtaining module 101 obtains basic function information of IP cores and relevant information of Network on chip (hereinafter NoC). The test name generating module 102 is configured to generate one or more test names according to the basic function information of IP cores and the relevant information of the NoC. The running module 103 involves an integral script to construct a running environment configured to invoke basic function scripts of the to-be-tested IP cores according to each of the test names which are generated, the basic function scripts being presented one by one. The test result generating module 104 generates results of testing. A detail function of the modules 101~104 will be described with reference to a flowchart of a method for applying tests.

Figure 2:
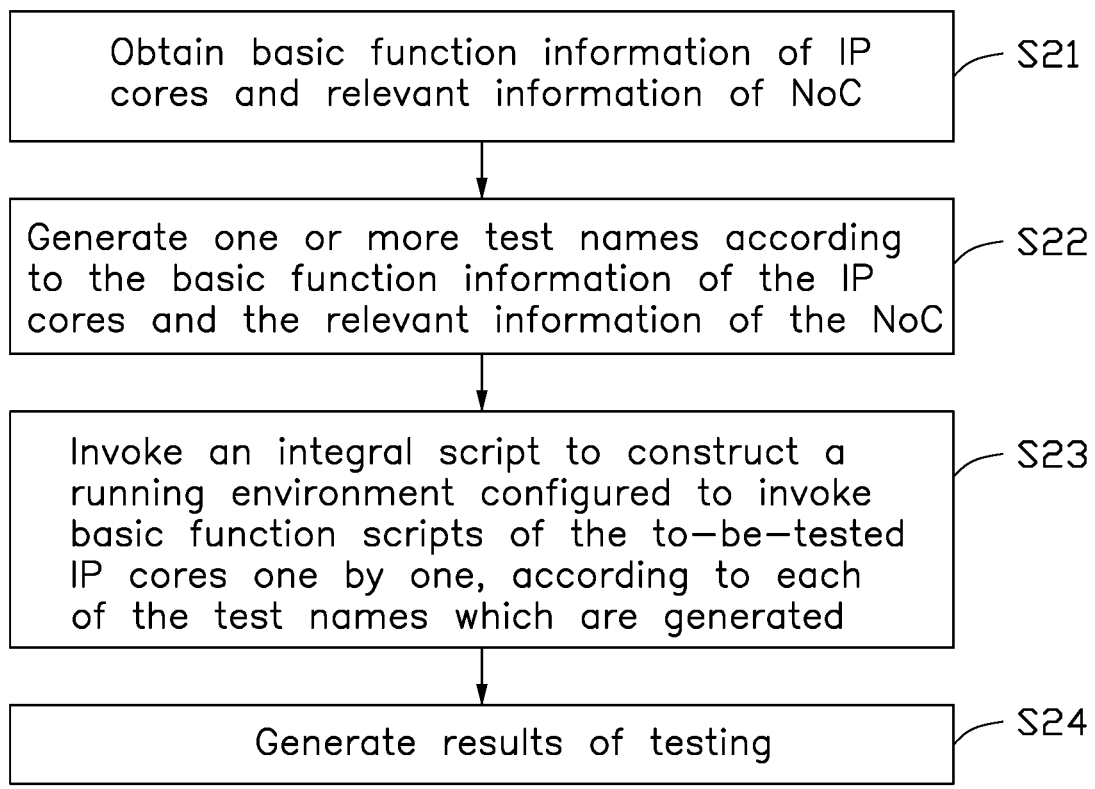
FIG. 2 illustrates a flowchart of a second embodiment of a method for applying tests according to the present disclosure.

FIG. 2 is a flowchart of a second embodiment of a method for applying tests (method for testing). The method for testing can begin at block S21.

At block S21, obtaining basic function information of IP cores and relevant information of NoC.

The basic function information of IP cores indicates functions of the IP cores. The functions of the IP cores include various roles in an SoC, such as having a controlling role, having a role of being controlled in the SoC, permitting the reading operation of a CPU, or the writing operation of a CPU, permitting direct memory access (hereinafter DMA), and the like. For example, a role of a secure digital input and output card (hereinafter SDIO) in the SoC is a role of being controlled, permitting a reading operation of the CPU or a writing operation of the CPU, and permitting a reading operation of the DMA or a writing operation of the DMA.

The NoC is a device for processing data transmission between IP cores in the SoC. The obtaining of basic function information of IP cores and relevant information of NoC can include a step a. The step a includes obtaining the basic function information of the IP cores and data transmission path in the NoC.

At block S22, generating one or more test names according to the basic function information of the IP cores and the relevant information of the NoC.

The generating of one or more test names according to the basic function information of the IP cores and the relevant information of the NoC includes a step b. The step b includes generating one or more test names which each includes a relationship between each of the to-be-tested IP cores according to the basic function information of the IP cores and the relevant information of the NoC.

Figure 3:
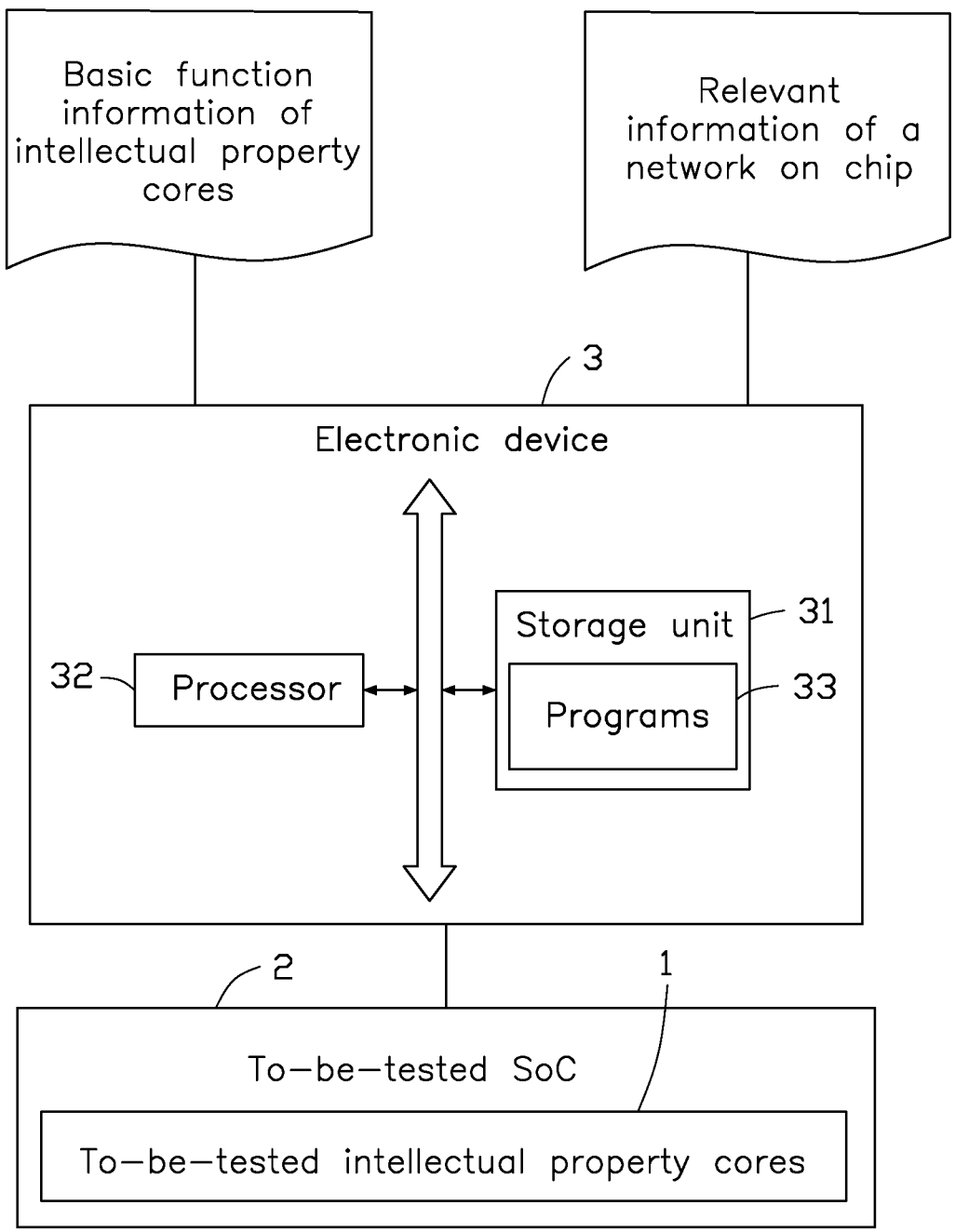
FIG. 3 illustrates a block diagram of a third embodiment of an electronic computing device according to the present disclosure.

In the embodiment, before the step b, the method for applying tests further includes identifying the information of each to-be-tested IP core 1 (see FIG. 3) in the to-be-tested SoC 2 (see FIG. 3). The step b includes generating one or more test names, each of which including a relationship between each of the to-be-tested IP cores according to the basic function information of the IP cores, the relevant information of the NoC, and the information of each to-be-tested IP core.

In the embodiment, the step b includes generating one or more test names which each includes a data transmission relationship between each of the to-be-tested IP cores according to the basic function information of the IP cores and the data transmission path in the NoC.

In the embodiment, the generating of one or more test names which each include a data transmission relationship between each of the to-be-tested IP cores according to the basic function information of the IP cores and the data transmission path in the NoC includes a step c. The step c includes generating one or more test names according to the basic function information of the IP cores and the data transmission path in the NoC, each test name including a to-be-tested IP core which executes a data writing operation, a to-be-tested IP core which executes a data reading operation, a to-be-verified and to-be-tested IP core, and the manner or manners of data transmission between the to-be-tested IP cores.

The to-be-verified and to-be-tested IP core includes a storage unit. Each test name includes Test_a to-be-tested IP core A_a to-be-verified and to-be-tested IP core B_manner of data transmission between the to-be-tested IP core A and the to-be-tested IP core B.

For example, it is known that the role of the SDIO in the SoC is a role of being controlled, permitting a reading operation of the CPU or a writing operation of the CPU, and permitting a reading operation of the DMA or a writing operation of the DMA according to the basic function information of the IP cores. It is known that the CPU can directly access the SDIO and the intellectual property core random access memory (hereinafter IPCRAM), and the SDIO can also directly access the IPCRAM according to the data transmission path in the SoC. Thus, the method generates two test names, respectively Test_SDIO_IPCRAM_CPURW and Test_SDIO_IPCRAM_DMARW.

At block S23, invoking an integral script to construct a running environment configured to invoke basic function scripts of the to-be-tested IP cores one by one, according to each of the test names which are generated.

The integral script is a pre-written script. The basic function scripts of the to-be-tested IP cores are all pre-written scripts. Each to-be-tested IP core includes at least one basic function, accordingly, the to-be-tested IP core includes at least one basic function script.

In the embodiment, the invoking of an integral script to construct a running environment to invoke basic function scripts of the to-be-tested IP cores one by one includes a step d. The step d includes invoking an integral script to construct the running environment to invoke basic function script of each to-be-tested IP core in the test names one by one.

For example, when a test name is Test_SDIO_IPCRAM_CPURW, the method calls up the integral script to construct the running environment to find basic function script of each to-be-tested IP core in one or more function scripts of each of the IP core CPU, the IP core SDIO, and the IP core IPCRAM according to the CPU, the SDIO, and the IPCRAM in the test name, thus a test script corresponding to each test name is called up.

In the embodiment, the invoking of an integral script to construct a running environment to invoke basis function scripts of the to-be-tested IP cores one by one, according to the test names one by one includes a step e. The step e includes invoking an integral script to construct the running environment to invoke basic function scripts of the to-be-tested IP cores one by one, according to the test names one by one and parameter information.

The parameter information includes a system starting process, an amount of data, a special testing manner for the interior of the IP core, a value of parameter, and so on.

At block S24, generating results of testing.

Each result of testing includes either a test passed or a test failed. Each test name corresponds to one result of testing. In the embodiment, the method for testing further includes generating a warning to check the integral script and the basic function script of the corresponding to-be-tested IP core if the result of testing is test failed. In the embodiment, the method for testing further includes generating a coverage of all the to-be-tested IP cores according to the results of testing.

The generating of a coverage of all the to-be-tested IP cores according to the results of testing includes a step f1 and a step f2. The step f1 includes determining which IP cores are tested according to the results of testing. The step f2 includes generating a coverage of all the to-be-tested IP cores according to the IP cores already tested IP cores and the all identified to-be-tested IP cores.

In this embodiment, basic function information of IP cores and relevant information of NoC are obtained, one or more test names according to the basic function information of IP cores and the relevant information of the NoC are generated, and an integral script is called up to construct a running environment to invoke basic function scripts of the to-be-tested IP cores one by one, according to the test names one by one, finally, results of testing are generated. By this disclosure, completeness of testing of the functions of the SoC is achieved and improved.

FIG. 3 illustrates a block diagram of a third embodiment of an electronic device (electronic device 3). The electronic device 3 can include a storage unit 31, at least one processor 32, and one or more programs 33 stored in the storage unit 31. The programs 33 can be run on the at least one processor 32. The at least one processor 32 can execute the one or more programs 33 to accomplish the steps of the exemplary method. Or, the at least one processor 32 can execute the one or more programs 33 to accomplish the functions of the modules of the exemplary device.

The one or more programs 33 can be divided into one or more modules/units. The one or more modules/units can be stored in the storage unit 31 and executed by the at least one processor 32 to accomplish the stated purpose. The one or more modules/units can be a series of program command segments which can perform specific functions, and the command segment is configured to describe the execution process of the one or more programs 33 in the electronic device 3. For example, the one or more programs 33 can be divided into modules as shown in the FIG. 1, the function of each module being as described in the first embodiment.

The electronic device 3 can be any suitable electronic device, for example, a personal computer, a tablet computer, a mobile phone, a PDA, or the like. A person skilled in the art knows that the device in FIG. 3 is only an example and is not to be considered as limiting the electronic device 3. Another example may include more or fewer parts, or may combine certain parts, or include different parts, such as another example including one or more buses, and so on.

The at least one processor 32 can be one or more central processing units, or it can be one or more other universal processors, digital signal processors, application specific integrated circuits, field-programmable gate arrays, or other programmable logic devices, discrete gate or transistor logic, discrete hardware components, and so on. The at least one processor 32 can be a microprocessor or the at least one processor 32 can be any regular processor or the like. The at least one processor 32 can be a control center of the electronic device 3, using a variety of interfaces and lines to connect various parts of the entire electronic device 3.

The storage unit 31 stores the one or more programs 33 and/or modules/units. The at least one processor 32 can run or execute the one or more programs and/or modules/units stored in the storage unit 31, call out the data stored in the storage unit 31 and accomplish the various functions of the electronic device 3. The storage unit 31 may include a program area and a data area. The program area can store an operating system, and applications that are required for the at least one function, such as sound playback features, image playback functions, and so on. The data area can store data created during use of the electronic device 3, such as audio data, and so on. In addition, the storage unit 31 can include a non-transitory storage medium, such as hard disk, memory, plug-in hard disk, smart media card, secure digital, flash card, at least one disk storage device, flash memory, or another non-transitory storage medium.

If the integrated modules/units of the electronic device 3 are implemented in the form of or by means of a software functional unit, and the electronic device 3 is an independent product sold or used, all parts of the integrated module/unit of the electronic device 3 may be stored in a computer-readable storage medium. The electronic device 3 can use one or more programs to control the related hardware to accomplish all parts of the method disclosed. The one or more programs can be stored in a computer-readable storage medium. The one or more programs can accomplish the blocks of the exemplary method when executed by the at least one processor. The one or more stored programs can include program code. The program code can be in the form of source code, object code, executable code, or in some intermediate form. The computer-readable storage medium may include any entity or device capable of recording and carrying the program codes, recording media, USB flash disk, mobile hard disk, disk, computer-readable storage medium, and read-only memory.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. A method for applying tests comprising:
   obtaining basic function information of a plurality of intellectual property cores and relevant information of a network on chip;
   generating one or more test names according to the basic function information of the intellectual property cores and the relevant information of the network on chip;
   invoking a pre-written integral script to construct a running environment configured to invoke a plurality of pre-written basic function scripts of to-be-tested intellectual property cores one by one, according to each of the one or more test names which are generated; and generating results of testing;
   wherein a method of obtaining the basic function information of a plurality of intellectual property cores and the relevant information of the network on chip comprises:
   obtaining the basic function information of the intellectual property cores and a data transmission path in the network on chip;
   wherein a method of generating the one or more test names according to the basic function information of the intellectual property cores and the relevant information of the network on chip comprises:
   generating the one or more test names according to the basic function information of the intellectual property cores and the data transmission path in the network on chip, each of the one or more test names comprising a to-be-tested intellectual property core which executes a data writing operation, a to-be-tested intellectual property core which executes a data reading operation, a to-be-verified and to-be-tested intellectual property core, and one or more manners of data transmission between the to-be-tested intellectual property cores.

2. The method according to claim 1, wherein a method of generating the one or more test names according to the basic function information of the intellectual property cores and the relevant information of the network on chip comprises:
   generating the one or more test names according to the basic function information of the intellectual property cores and the relevant information of the network on chip, each of the one or more test names comprising a relationship between each of the to-be-tested intellectual property cores;
   wherein a method of invoking the pre-written integral script to construct the running environment configured to invoke the pre-written basic function scripts of to-be-tested intellectual property cores one by one, according to each of the one or more test names which are generated comprises:
   invoking the pre-written integral script to construct the running environment configured to invoke each of the pre-written basic function scripts of each of the to-be-tested intellectual property cores in the one or more test names one by one, according to each of the one or more test names which are generated.

3. The method according to claim 2, wherein:
   a method of generating the one or more test names according to the basic function information of the intellectual property cores and the relevant information of the network on chip, each of the one or more test names comprising the relationship between each of the to-be-tested intellectual property cores comprises:
   generating the one or more test names according to the basic function information of the intellectual property cores and the data transmission path in the network on chip, each of the one or more test names comprising the relationship of a data transmission between each of the to-be-tested intellectual property cores.

4. The method according to claim 2, wherein:
   before generating the one or more test names according to the basic function information of the intellectual property cores and the relevant information of the network on chip, each of the one or more test names comprising the relationship between each of the to-be-tested intellectual property cores, the method further comprises:
   identifying the information of each of the to-be-tested intellectual property cores in the to-be-tested system-on-chip; and wherein:
   a method of generating the one or more test names according to the basic function information of the intellectual property cores and the relevant information of the network on chip, each of the one or more test names comprising the relationship between each of the to-be-tested intellectual property cores comprises:
   generating the one or more test names according to the basic function information of the intellectual property cores, the relevant information of the network on chip, and the information of each of the to-be-tested intellectual property cores, each of the one or more test names comprising the relationship between each of the to-be-tested intellectual property cores.

5. The method according to claim 1, wherein the to-be-verified and to-be-tested intellectual property core comprises a storage unit.

6. The method according to claim 1 further comprising:
generating a coverage of all of the to-be-tested intellectual property cores according to the results of testing.

7. An electronic device comprising:
a storage device;
at least one processor; and
the storage device storing one or more programs, which when executed by the at least one processor, cause the at least one processor to:
obtain basic function information of a plurality of intellectual property cores and relevant information of a network on chip;
generate one or more test names according to the basic function information of the intellectual property cores and the relevant information of the network on chip;
invoke a pre-written integral script to construct a running environment configured to invoke a plurality of pre-written basic function scripts of to-be-tested intellectual property cores one by one, according to each of the one or more test names which are generated;
generate results of testing;
further causing the at least one processor to:
obtain the basic function information of the intellectual property cores and a data transmission path in the network on chip;
generate the one or more test names according to the basic function information of the intellectual property cores and the data transmission path in the network on chip, each of the one or more test names comprising a to-be-tested intellectual property core which executes a data writing operation, a to-be-tested intellectual property core which executes a data reading operation, a to-be-verified and to-be-tested intellectual property core, and one or more manners of data transmission between the to-be-tested intellectual property cores.

8. The electronic device according to claim 7, further causing the at least one processor to:
generate the one or more test names according to the basic function information of the intellectual property cores and the relevant information of the network on chip, each of the one or more test names comprising a relationship between each of the to-be-tested intellectual property cores;
invoke the pre-written integral script to construct the running environment configured to invoke each of the pre-written basic function scripts of each of the to-be-tested intellectual property cores in the one or more test names one by one, according to each of the one or more test names which are generated.

9. The electronic device according to claim 8, further causing the at least one processor to:
generate the one or more test names according to the basic function information of the intellectual property cores and the data transmission path in the network on chip, each of the one or more test names comprising the relationship of a data transmission between each of the to-be-tested intellectual property cores.

10. The electronic device according to claim 8, further causing the at least one processor to:
identify the information of each of the to-be-tested intellectual property cores in the to-be-tested system-on-chip;
generate the one or more test names according to the basic function information of the intellectual property cores, the relevant information of the network on chip, and the information of each of the to-be-tested intellectual property cores, each of the one or more test names comprising the relationship between each of the to-be-tested intellectual property cores.

11. The electronic device according to claim 7, wherein the to-be-verified and to-be-tested intellectual property core comprises a storage unit.

12. The electronic device according to claim 7, further causing the at least one processor to:
generate a coverage of all of the to-be-tested intellectual property cores according to the results of testing.

13. A non-transitory storage medium storing a set of commands, when the commands being executed by at least one processor of an electronic device, causing the at least one processor to:
obtain basic function information of a plurality of intellectual property cores and relevant information of a network on chip;
generate one or more test names according to the basic function information of the intellectual property cores and the relevant information of the network on chip;
invoke a pre-written integral script to construct a running environment configured to invoke a plurality of pre-written basic function scripts of to-be-tested intellectual property cores one by one, according to each of the one or more test names which are generated;
generate results of testing;
further causing the at least one processor to:
obtain the basic function information of the intellectual property cores and a data transmission path in the network on chip;
generate the one or more test names according to the basic function information of the intellectual property cores and the data transmission path in the network on chip, each of the one or more test names comprising a to-be-tested intellectual property core which executes a data writing operation, a to-be-tested intellectual property core which executes a data reading operation, a to-be-verified and to-be-tested intellectual property core, and one or more manners of data transmission between the to-be-tested intellectual property cores.

14. The non-transitory storage medium according to claim 13, further causing the at least one processor to:
generate the one or more test names according to the basic function information of the intellectual property cores and the relevant information of the network on chip, each of the one or more test names comprising a relationship between each of the to-be-tested intellectual property cores;
invoke the pre-written integral script to construct the running environment configured to invoke each of the pre-written basic function scripts of each of the to-be-tested intellectual property cores in the one or more test names one by one, according to each of the one or more test names which are generated.

15. The non-transitory storage medium according to claim 14, further causing the at least one processor to:
generate the one or more test names according to the basic function information of the intellectual property cores and the data transmission path in the network on chip, each of the one or more test names comprising the relationship of a data transmission between each of the to-be-tested intellectual property cores.

16. The non-transitory storage medium according to claim 14, further causing the at least one processor to:
- identify the information of each of the to-be-tested intellectual property cores in the to-be-tested system-on-chip;
- generate the one or more test names according to the basic function information of the intellectual property cores, the relevant information of the network on chip, and the information of each of the to-be-tested intellectual property cores, each of the one or more test names comprising the relationship between each of the to-be-tested intellectual property cores.

17. The non-transitory storage medium according to claim 13, wherein the to-be-verified and to-be-tested intellectual property core comprises a storage unit.

* * * * *